(12) United States Patent
Whetsel et al.

(10) Patent No.: US 7,956,357 B2
(45) Date of Patent: Jun. 7, 2011

(54) TEST PADS COUPLED WITH LEADS UNCONNECTED WITH DIE PADS

(75) Inventors: Lee D. Whetsel, Parker, TX (US); Richard L. Antley, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 5 days.

(21) Appl. No.: 12/495,060

(22) Filed: Jun. 30, 2009

(65) Prior Publication Data

US 2009/0261326 A1 Oct. 22, 2009

Related U.S. Application Data

(62) Division of application No. 12/047,907, filed on Mar. 13, 2008, now Pat. No. 7,569,853, which is a division of application No. 11/279,509, filed on Apr. 12, 2006, now Pat. No. 7,368,304, which is a division of application No. 10/610,437, filed on Jun. 30, 2003, now Pat. No. 7,056,752, which is a division of application No. 10/051,536, filed on Jan. 18, 2002, now Pat. No. 6,590,225.

(60) Provisional application No. 60/263,134, filed on Jan. 19, 2001.

(51) Int. Cl.
*H01L 23/58* (2006.01)
(52) U.S. Cl. ................... 257/48; 324/762.01
(58) Field of Classification Search ............... 257/48; 438/10, 11, 14, 15, 17, 18; 324/765–769, 324/537, 750.01, 750.16, 762.01, 762.02, 324/762.05
See application file for complete search history.

(56) References Cited

U.S. PATENT DOCUMENTS

| | | | | |
|---|---|---|---|---|
| 5,506,499 A | * | 4/1996 | Puar | 324/158.1 |
| 6,097,098 A | * | 8/2000 | Ball | 257/786 |
| 6,180,426 B1 | * | 1/2001 | Lin | 438/15 |
| 6,535,999 B1 | * | 3/2003 | Merritt et al. | 714/30 |
| 7,399,990 B2 | * | 7/2008 | Maruyama | 257/48 |
| 7,569,853 B2 | * | 8/2009 | Whetsel et al. | 257/48 |

* cited by examiner

*Primary Examiner* — Kevin M Picardat
(74) *Attorney, Agent, or Firm* — Lawrence J. Bassuk; W. James Brady; Frederick J. Telecky, Jr.

(57) ABSTRACT

Timely testing of die on wafer reduces the cost to manufacture ICs. This disclosure describes a die test structure and process to reduce test time by adding test pads on the top surface of the die. The added test pads allow a tester to probe and test more circuits within the die simultaneously. Also, the added test pads contribute to a reduction in the amount of test wiring overhead traditionally required to access and test circuits within a die, thus reducing die size.

7 Claims, 15 Drawing Sheets

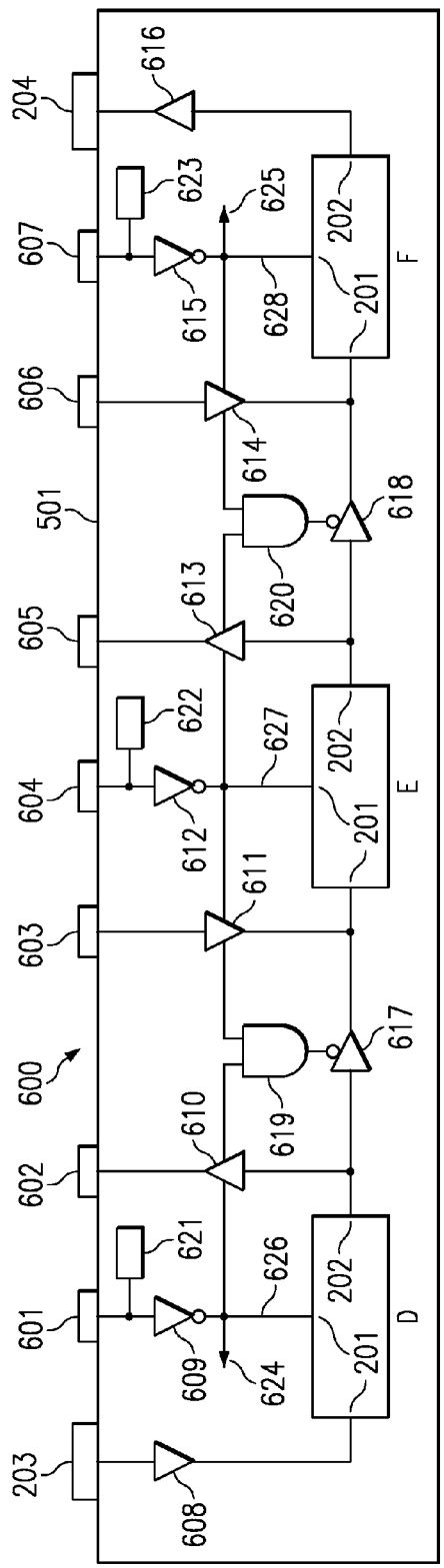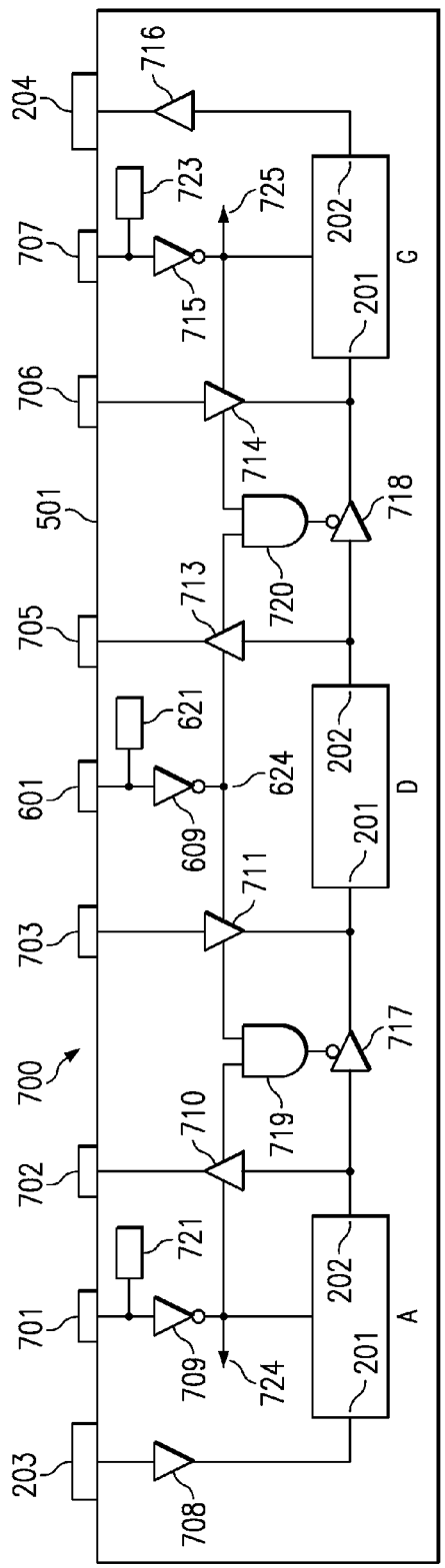

TEST PADS COUPLED WITH LEADS UNCONNECTED WITH DIE PADS

This is a divisional of application Ser. No. 12/047,907, filed Mar. 13, 2008, now U.S. Pat. No. 7,569,853, issued Aug. 4, 2009;

Which was a divisional of application Ser. No. 11/279,509, filed Apr. 12, 2006, now U.S. Pat. No. 7,368,304, issued May 6, 2008;

Which was a divisional of application Ser. No. 10/610,437, filed Jun. 30, 2003, now U.S. Pat. No. 7,056,752, issued Jun. 6, 2006;

which was a divisional of application Ser. No. 10/051,536, filed Jan. 18, 2002, now U.S. Pat. No. 6,590,225, issued Jul. 8, 2003;

which claims priority from provisional application 60/263,134, filed Jan. 19, 2001.

PRIOR ART DESCRIPTION

FIG. 1 illustrates a semiconductor wafer 101 comprising multiple die 102. After the wafer 101 is manufactured all die 102 on the wafer must be tested to identify good die from bad die. The testing of all die on wafer can be a time consuming process, especially when the die contain multiple complex digital and/or analog circuits, which is the current trend in the semiconductor industry.

FIG. 2 illustrates a more detail example of one of the die 102. As seen in FIG. 2, the die 102 contains multiple embedded circuits A-I. The circuits A-I could be any type of circuits such as digital signal processor cores, microprocessor cores, mixed signal circuits such ADCs and DACs, peripherals, or memories. Each circuit A-I has input 201 and output 202 terminals. The die has input 203 and output 204 pads for connecting to external circuitry. Internally, the circuits A-I are connected together at their input 201 and output 202 terminals via connections 206, allowing them to function together. Certain of the circuits A-I are connected to the die input 203 and output 204 pads via connections 205 and 207 to allow external communication. Typically, during the test of the die 102, each circuit A-I is individually tested. The following examples in FIGS. 3 and 4 describe how a conventional test approach can be used for selecting and testing the circuits A-I of die 102.

FIG. 3 illustrates a prior art test approach whereby the die is configured to connect the input 201 and output 202 terminals of circuit E to the die input 203 and output 204 pads via test bussing paths 301-304. A similar test approach where inputs and outputs of embedded circuits are bussed to die pads for testing, as shown in FIG. 3, is described in TI patent U.S. Pat. No. 5,005,173.

FIG. 4 illustrates an example test arrangement 400 consisting of die 102 to be tested, tester 401 to supply test patterns, and probe mechanism 402 for making connections between tester 401 and pads of die 102. It is assumed that Die 102 is configured for testing circuit E as described in regard to FIG. 3. During test, the tester 401 outputs test stimulus patterns to the input terminals 201 of circuit D via input pads 203 and test bussing paths 301 and 302, and inputs test response patterns from output terminals 202 of circuit E via test bussing paths 303 and 304. In this example, it is assumed that circuit E does not contain design for test features, such as scan design, so functional testing must be performed on circuit E by manipulation of all, or at least a significant number of, the circuit E input and output terminals.

When testing of circuit E is complete, another circuit, such as D may be selected and connected to the input 203 and output 204 pads, via additional test bussing paths, like 301-304, and tested like circuit E was described being tested. During the testing of die 102, all circuits A-I will eventually be selected and tested in the manner described above. Since some of the circuits A-I are directly connected on at least some of their input 201 and output 202 terminals to input 203 and output 204 pads, fewer additional test bussing paths may be required for their testing. However, all circuits A-I that have input 201 and output 202 terminals that are not functionally connected to input 203 and output 204 pads will require a test bussing path to be configured during test.

While the test approach of using configurable test bussing paths to select and test embedded circuits, as described above, is a simple process, it introduces two key problems. The first problem is that the additional test bussing paths required for selecting and testing the circuits adds circuitry and wiring overhead to the die, thus increasing die size and potentially increasing the amount of noise and crosstalk produced during functional operation of the die. The second problem is that when some of the input 203 and output 204 pads are being used to test one of the circuits A-I, they cannot necessarily also be used to test another of the circuits A-I. For example, since some of the input 201 terminals of circuits D and E are connected during test to a common set of input 203 pads, via test bus 301, it is not possible to test circuits D and E simultaneously. Thus, testing of the circuits A-I of die 102 may need to occur in a one-at-a-time fashion, which leads to longer die test times. The present invention, as described in detail below, provides solutions for these two problems.

BRIEF DRAWING DESCRIPTION

FIG. 6 illustrates a first view of test pads and circuitry of the invention.

FIG. 7 illustrates a second view of test pads and circuitry of the invention.

INVENTION DESCRIPTION

Figure 5:
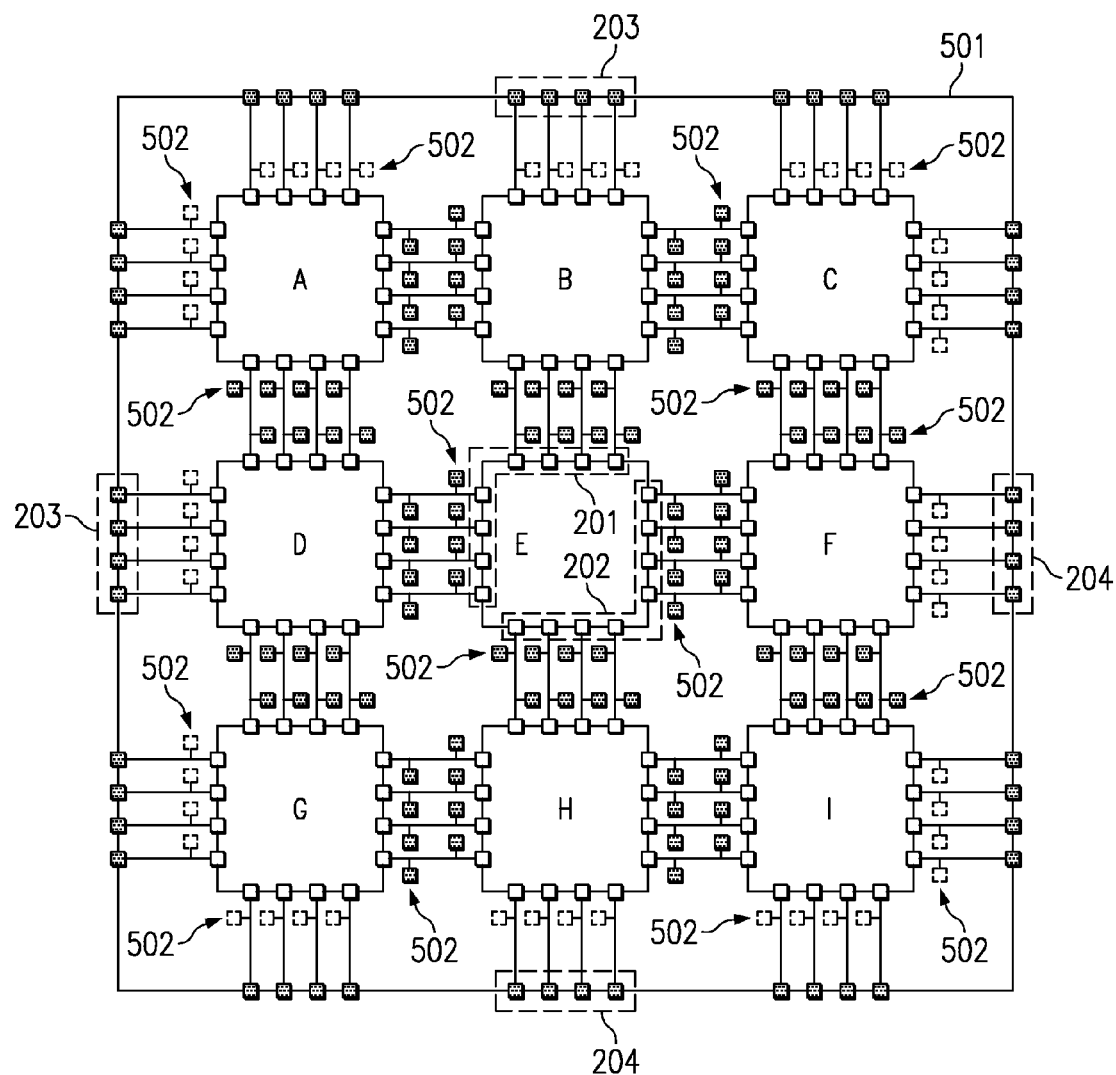
FIG. 5 illustrates a die with top surface test pads according to the invention.

FIG. 5 illustrates a die 501 according to the present invention. Die 501 is the same as die 201 with the exception that top surface test pads 502 have been processed onto the die and connected to associated ones of the input 201 and output 202 terminals of circuits A-I. Test pads 502 differ from the die input 203 and output 204 pads in that they are used to provide test access to the circuits A-I and not for functional communication to circuits external to die 501. As seen in FIG. 5, the test pads 502 are preferably located in close proximity to an associated input 201 terminal or output 202 terminal of circuits A-I. Also as seen, a circuit A-I need not necessarily have a test pad associated with an input 201 or output 202 terminal if test access is already provided by an input 203 or output 204 die pad. For example, circuit D does not need test pads 502 on its input 201 terminals that are functionally connected to input 203 die pads. Similarly, circuit F does not necessarily need test pads 502 on its output 202 terminals that are functionally connected to output 204 die pads. However, test pads 502 may be located on these input 201 and output 202 terminals, as indicated by dotted line test pads 502, if it is desired not to probe the die input 203 and output 204 die pads. A reason for not probing the input 203 and output 204 die pads would be to avoid marring the die pads, which could lead to continuity problems when die is either mounted onto a substrate or assembled into a package. For example, the solder connections between die pads and a substrate footprint may be improved if the die pads 203, 204 are not scarred during probe testing. Further, bonding of the die pads 203, 204 to a lead frame may be improved if the die pads are not scarred during die probe testing.

FIG. 6 illustrates a horizontal cross-sectional schematic view 600 of die 501 as an aid in revealing the test circuitry and wiring associated with the test pads 502 according to the invention. To simplify the following description, only horizontally positioned circuits D, E, and F of die 501 are shown. Also, test pads 502 of FIG. 5 have been relabeled as test pads 601-607 in FIG. 6. As seen in FIG. 6, conventional input 203 and output 204 pads have been processed at the perimeter of the die to provide said external input and output communication. During test these input 203 and output 204 pads are additionally used to provide test inputs to circuit D and test outputs from circuit F. As seen in FIG. 6, the test pads 601-607 have been processed on the top surface of the die to provide test input and output access to circuits D-F.

Input pads 203 are connected to inputs of functionally required input buffers 608 which drive the input terminals 201 of circuit D. Output pads 204 are connected to the outputs of functionally required output buffers 616 which are driven by output terminals 202 of circuit F.

Test pad 601 is provided as a test enable input for circuit D. Test pad 601 is connected to the input of a test buffer 609. The output of test buffer 609 is connected to the enable input of test buffers 610 and to a first input of OR gate 619. The output of test buffer 609 also drives lead 624 which will be described later in regard to FIG. 7. The output of gate 619 is connected to the enable input of test isolation buffers 617. The output of test buffer 609 may also be connected 626 as an input to circuit D, via an input terminal 201, to enable circuit D for testing. For example, circuit D may have one or more test modes which can be invoked by input on test pad 601 to simplify its testing. There may be a plurality of test pads 601 and test buffers 609 if circuit D requires plural inputs to invoke its test modes. However, at least one of the test pads 601 and test buffers 609 needs to be used for enabling and disabling test buffers 610 and isolation buffers 617. Test pads 602 are provided as test outputs for circuit D. Test pads 602 are connected to the outputs of a test buffers 610. The inputs of test buffers 610 are connected to the output terminals 202 of circuit D.

Test pads 603 are provided as a test inputs for circuit E. Test pads 603 are connected to the inputs of test buffers 611. The outputs of test buffers 611 are connected to the input terminals 201 of circuit E. Test pad 604 is provided as a test enable input for circuit E. Test pad 604 is connected to the input of a test buffer 612. The output of test buffer 612 is connected to the enable inputs of test buffers 611 and 613, to a second input of OR gate 619, and to a first input of OR gate 620. The output of gate 620 is connected to the enable input of test isolation buffers 618. As mentioned in regard to test pad 601 and test buffer 609, one or more test pads 604 and test buffers 612 may provide input 627 to circuit E to enable its testing. Test pads 605 are provided as test outputs for circuit E. Test pads 605 are connected to the outputs of a test buffers 613. The inputs of test buffers 613 are connected to the output terminals 202 of circuit E.

Test pads 606 are provided as a test inputs for circuit F. Test pads 606 are connected to the inputs of test buffers 614. The outputs of test buffers 614 are connected to the input terminals 201 of circuit F. Test pad 607 is provided as a test enable input for circuit F. Test pad 607 is connected to the input of a test buffer 615. The output of test buffer 615 is connected to the enable inputs of test buffers 614, and to a second input of OR gate 620. The output of test buffer 615 also drives lead 625 which will be described later in regard to FIG. 8. Again, one or more test pads 607 and test buffers 615 may be connected as input 628 to circuit F to enable its testing.

Pull up circuits 621-623 are located on the inputs of test buffers 609, 612, and 615. The purpose of the pull up circuits is to force the test circuitry into a state that will not interfere with the functional operation of the circuits A-I when the die is not being tested. For example, if test pads 601, 604, and 607 are not being driven by an external circuit/tester, the pull up circuits will force the inputs of test buffers 609, 612, and 615 high. Since test buffers 609, 612, and 615 are inverting types, their outputs will be set low while their inputs are high. In this example, a low on the outputs of test buffers 609, 612, and 615 will disable the outputs of test buffers 610, 611, 613, and 614, and enable the outputs of test isolation buffers 617 and 618. Thus circuits D, E, and F of FIG. 6 may functionally communicate via the test isolation buffers 617 and 618 while test pads 601, 604, and 607 are not being driven low by an external circuit/tester.

FIG. 7 illustrates a vertical cross-sectional schematic view 700 of circuits A, D and G of die 501. The purpose of FIG. 7 is show how lead 624 of FIG. 6 is used to control further test input to circuit D from additional test pads 703 and to control further test output from circuit D from additional test pads 705. When test pad 601 is driven low, lead 624 goes high. In response to lead 624 being high, the outputs of test isolation buffers 717 and 718 are disabled, via OR gates 719 and 720, and the outputs of test buffers 711 and 713 are enabled. In this condition, circuit D can receive test input from test pads 703 and transmit test output from test pads 705. Thus when FIGS. 6 and 7 are viewed together, it can be seen that complete test input and output access is provided to circuit D using a combination of test pads 603, 605, 703, and 705 and die pads 203 and 204. The die pads 203, test pads 701-702, buffers 708-710, pull up 721, and lead 724 elements associated with circuit A of FIG. 7 relate to the die pads 203, test pads 601-602, buffers 608-610, pull up 621, and lead 624 elements previously described in regard to circuit D of FIG. 6. Further, the die pads 204, test pads 706-707, buffers 714-716, pull up 723, and lead 725 elements associated with circuit G of FIG. 7 relate to the die pads 204, test pads 606-607, buffers 614-616, pull up 623, and lead 625 elements previously described in regard to circuit F of FIG. 6.

Figure 8:
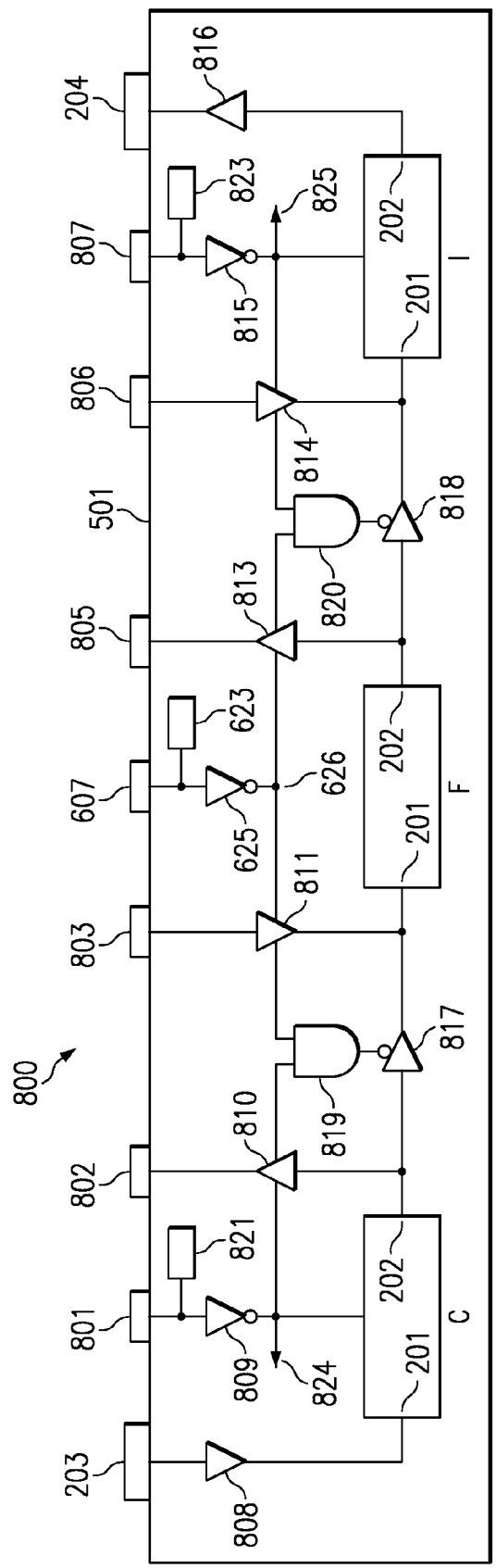
FIG. 8 illustrates a third view of test pads and circuitry of the invention.

FIG. 8 illustrates a vertical cross-sectional schematic view 800 of circuits C, F and I of die 501. The purpose of FIG. 8, as with FIG. 7, is show how lead 625 of FIG. 6 is used to control further test input to circuit F from additional test pads 803 and to control further test output from circuit F from additional test pads 805. When test pad 607 is driven low, lead 625 goes high. In response to lead 625 being high, the outputs of test isolation buffers 817 and 818 are disabled, via OR gates 819 and 820, and the outputs of test buffers 811 and 813 are enabled. In this condition, circuit F can receive test input from test pads 803 and transmit test output from test pads 805. Thus when FIGS. 6 and 8 are viewed together, it can be seen that complete test input and output access is provided to circuit F using a combination of test pads 603, 605, 803, and 805 and die pads 203 and 204. The die pads 203, test pads 801-802, buffers 808-810, pull up 821, and lead 824 elements associated with circuit C of FIG. 8 relate to the die pads 203, test pads 601-602, buffers 608-610, pull up 621, and lead 624 elements previously described in regard to circuit D of FIG. 6. Further, the die pads 204, test pads 806-807, buffers 814-816, pull up 823, and lead 825 elements associated with circuit I of FIG. 8 relate to the die pads 204, test pads 606-607, buffers 614-616, pull up 623, and lead 625 elements previously described in regard to circuit F of FIG. 6. From the above description of FIGS. 6-8 and in reference to the die circuit example of FIG. 5, it is clear that only circuit A receives test input exclusively from die pads 203 and only circuit I transmits test output exclusively from die pads 204. Thus circuit A test buffer 709 of FIG. 7 need only control (i.e. enable/disable) the outputs of test buffers and test isolation buffers associated with the output terminals 202 of circuit A, and circuit I test buffer 815 of FIG. 8 need only control the outputs of test buffers and test isolation buffers associated with the input terminals 201 of circuit I. The test enable buffers of circuits B, C, D, F, G, and H of die 501 will need to control the outputs of all test buffers and test isolation buffers that are associated with each circuit's input 201 and output 202 terminals. Circuit E of die 501 is the only circuit that receives test input and transmits test output exclusively using test pads 502. All other circuits in die 501 receive test input and transmit test output using a combination of die pads 203 and 204 and test pads 502.

Figure 9:
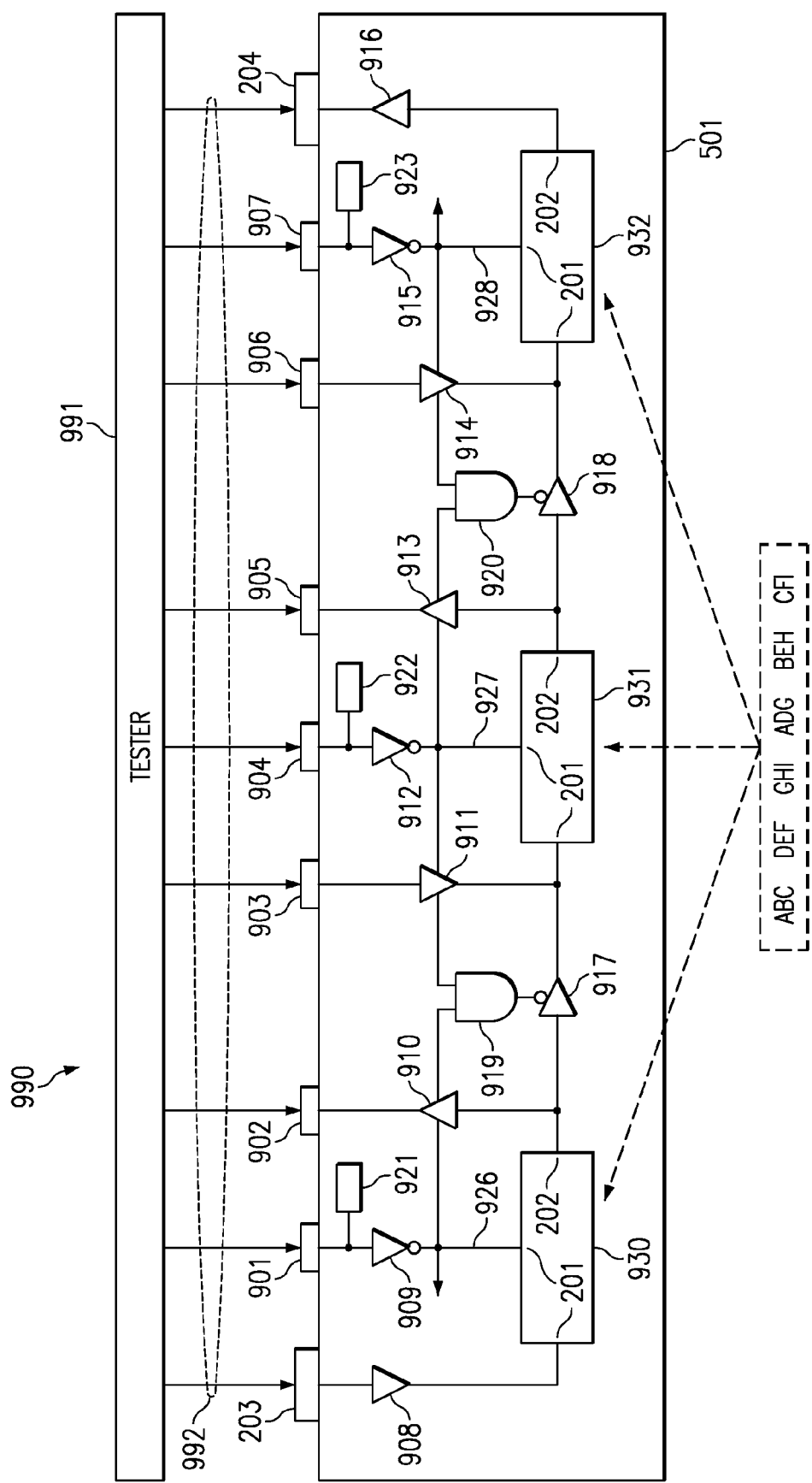
FIG. 9 illustrates a first die test arrangement according to the invention.

FIG. 9 illustrates a test arrangement 900 consisting of a tester 901, probe mechanism 902 and die 501 to be tested. Circuit blocks 930-932 of FIG. 9 represent all the vertical and horizontal schematic views of circuits A-I in die 501, i.e. circuits 930-932 represent horizontal views of circuits ABC, DEF, GHI, and circuits 930-932 represent vertical views of circuits ADG, BEH, and CFI. During testing of circuits 930-932, tester 901 sets test pads 901, 904, 907 low and inputs and output test patterns to circuits 930-932 as previously described using a combination of die pads 203, 204 and test pads 902, 903, 905, 907. During test, the outputs of test isolation buffers 917 and 918 are disabled to isolate the circuits 930-932 from one another so that each circuit may received test input from and transmit test output to tester 901 via test buffers 910, 911, 913, and 914. As can be seen from FIG. 9, all the circuits 930-932 can be tested individually, in selected groups, or all at once since all the circuit's input 201 and output 202 terminals are available to the tester 901. Being able to test all circuits 930-932 at the same time reduces the die 501 test time and therefore the wafer 101 test time, which reduces manufacturing cost.

Figure 10:
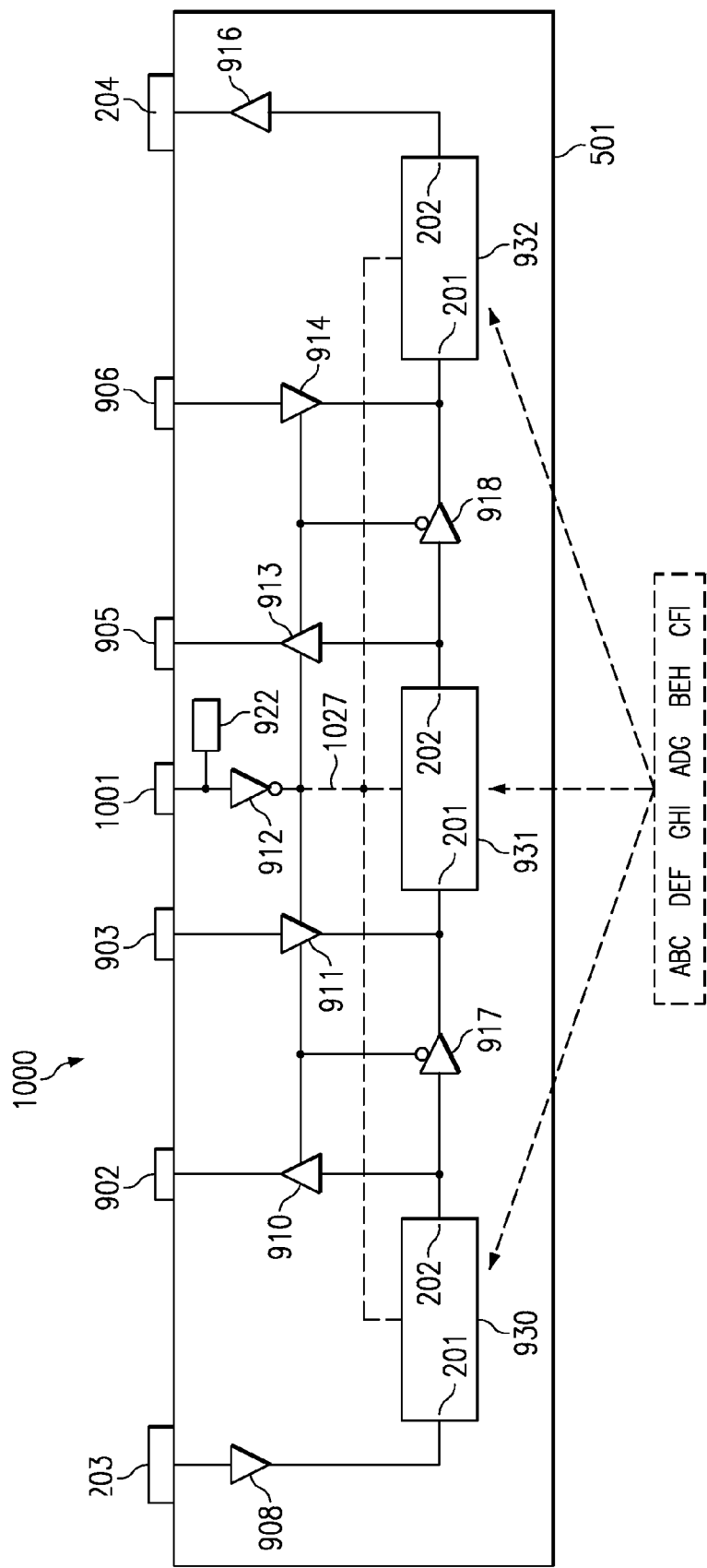
FIG. 10 illustrates a simplified view of test pads and circuitry of the invention.
Figure 11:
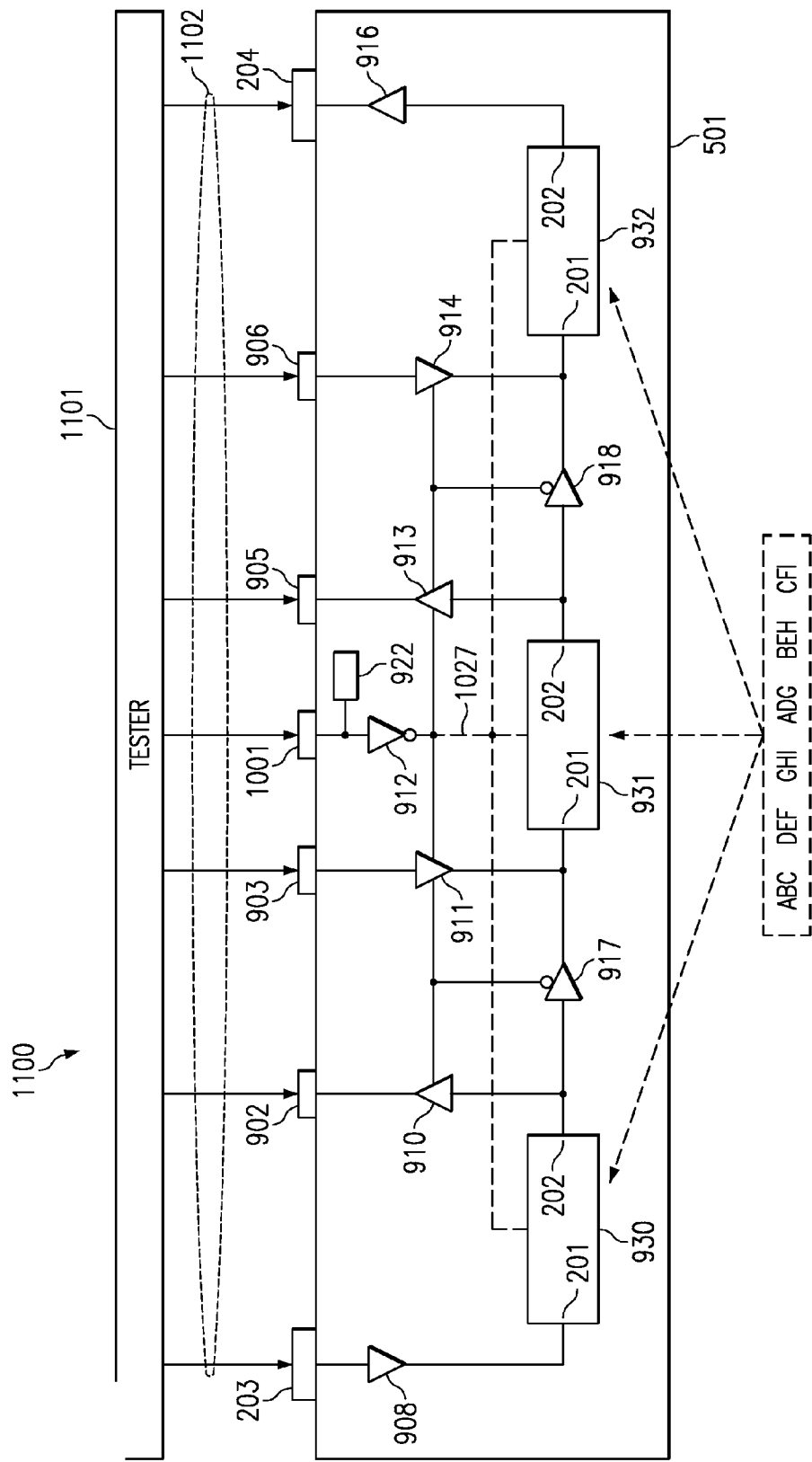
FIG. 11 illustrates a second die test arrangement according to the invention.

FIG. 10 illustrates a simplification of the die 501 test circuitry 1000 described in regard to FIGS. 6-9. The simplification is based on the use of a single test enable pad 1001 as the enable/disable control input to all test buffers and test isolation buffers. This simpler test architecture can be used whenever it is determined that all circuits A-I will always be accessed for testing at the same time, as opposed to the selective test access provided by the test architectures of FIG. 6-9. As seen in FIG. 10, the OR gates 919-920 have been deleted and a direct connection is made between the output of the test buffer 912 and control inputs of test isolation buffers 917 and 918. Also, only a single pull up circuit 922 is required to maintain a high state at the input of test buffer 912 when it is not externally driven. As previously described, each circuit 930-932 may receive an input from the single test enable pad 1001 via connection 1027 to place them in a test mode. FIG. 11 illustrates a test arrangement 1100 whereby a tester 1101 makes contact to the die 501 of FIG. 10, via probe mechanism 1102, and uses the single test pad 1001 to access all input 201 and output 202 terminals of circuits 930-932 for testing.

Figure 12:
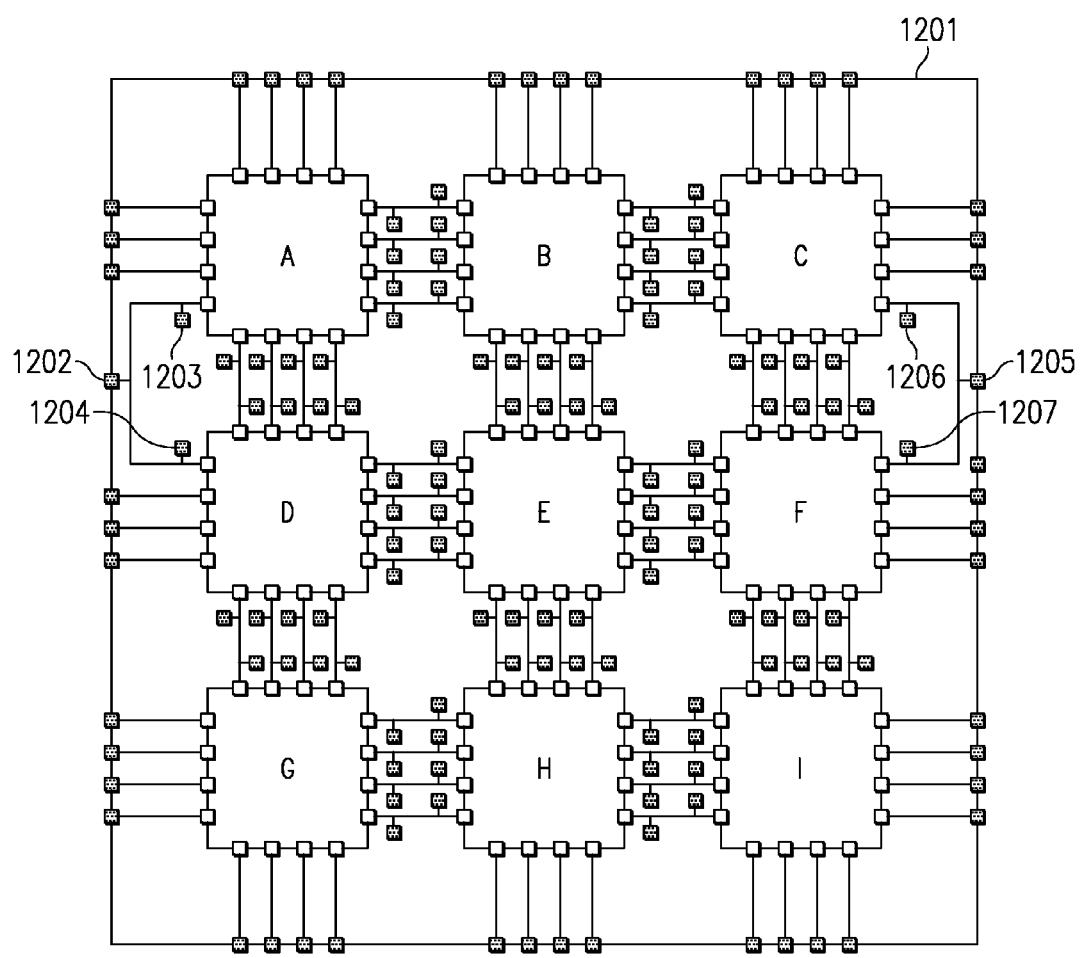
FIG. 12 illustrates a die with top surface test pads according to the invention.

FIG. 12 illustrates a die 1201 that includes a circuit A and circuit D that have input terminals connected to common die input pads 1202. Also, die 1201 includes a circuit C and circuit F that have output terminals connected to common die output pads 1205. To allow simultaneous testing of circuits A and D, test pads 1203 and 1204 are provided at the test input terminals of circuits A and D and test pads 1206 and 1207 are provided at the test output terminals of circuits C and F. As opposed to the optional use of the dotted line test pads 502 of FIG. 5 to prevent marring of the die pads 203 and 204, these test pads (1203, 1204, 1206, 1207) are required if circuits A and D, and circuits C and F are to be tested simultaneously.

Figure 13:
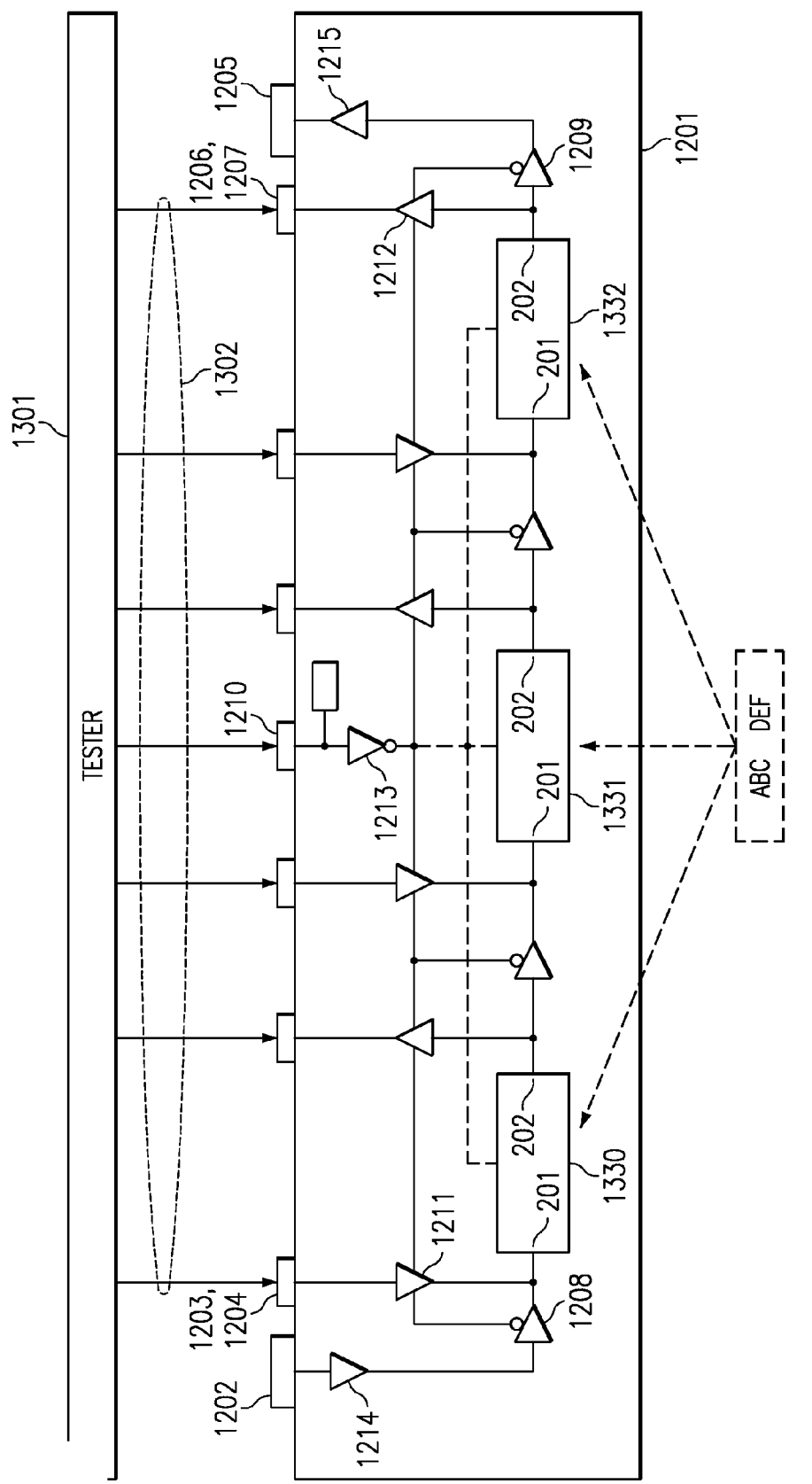
FIG. 13 illustrates a third die test arrangement according to the invention.

FIG. 13 illustrates a test arrangement consisting of a tester 1301, probe mechanism 1302, and a horizontal cross sectional schematic view of die 1201. Circuits 1330-1332 represent circuits ABC and DEF of FIG. 12. In FIG. 13, test pads 1203 and 1204 are connected to the inputs of test buffers 1211. The outputs of test buffers 1211 are connected to the shared input terminals 201 of circuits A and D. Also, test isolation buffers 1208 are inserted between the output of shared input buffers 1214 driven by die pads 1202 and input terminals 201 of circuits A and D. Test pads 1206 and 1207 are connected to the outputs of test buffers 1212. The inputs of test buffers 1212 are connected to the shared output terminals 202 of circuits C and F. Also, test isolation buffers 1209 are inserted between the output terminals of circuits C and F and the input of the shared output buffers 1215, which drives die pads 1205.

As can be seen from FIG. 13, when the die is placed in test mode by a low on test pad 1210, the outputs of test isolation buffers 1208 and 1209 are disabled and the outputs of test buffers 1211 and 1212 are enabled. In this mode the tester can simultaneously input different test data to circuits A and D via test pads 1203 and 1204 respectively, and output different test data from circuits C and F via test pads 1206 and 1207 respectively. Thus circuits A and D, and circuits C and F can be simultaneously tested by the application of test pads and associated test and isolation buffers at their shared input and output terminals.

Figure 14:
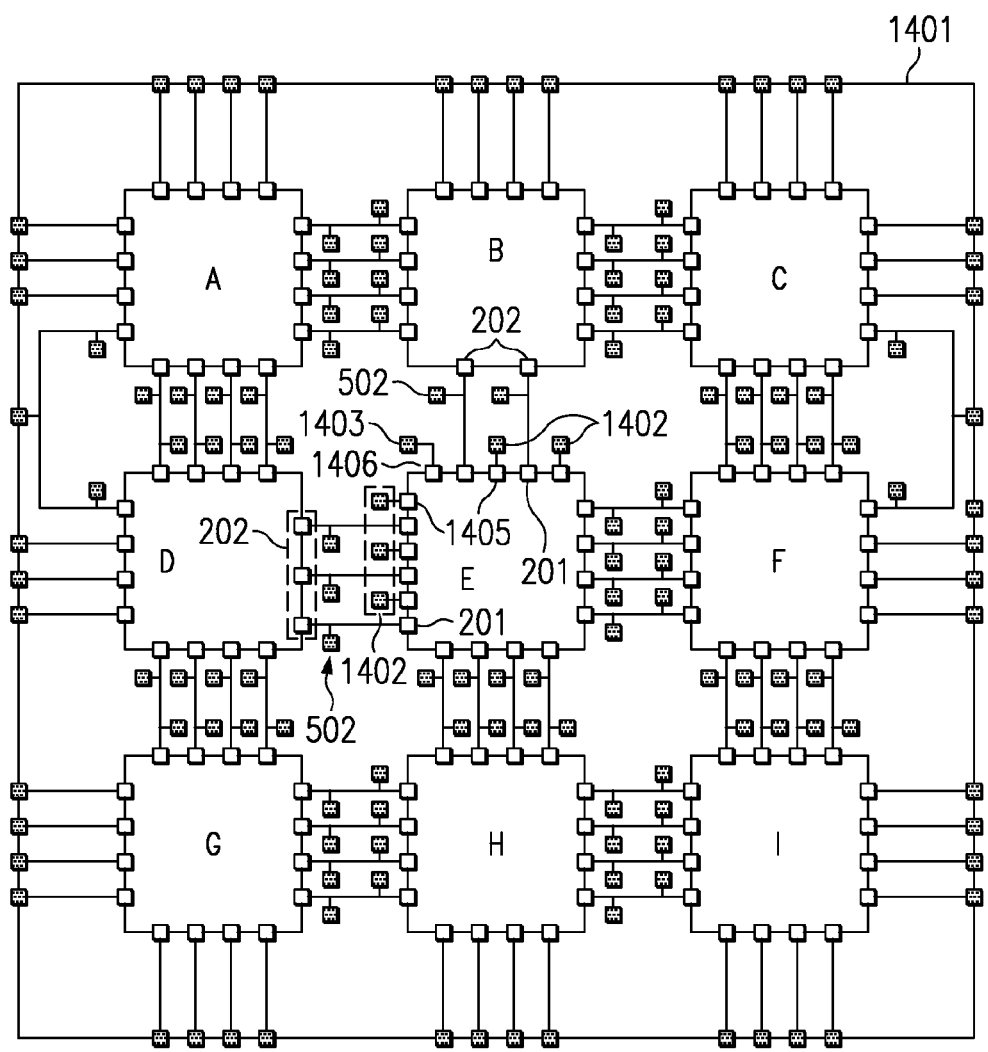
FIG. 14 illustrates a circuit in a die equipped with dedicated input terminals for connecting to top surface test pads according to the invention.

FIG. 14 illustrates a die 1401 that includes a circuit E that has been designed to include test input terminals 1405 for connecting to top surface test pads 1402, and input terminals 201 for connecting to the output terminals 202 of circuits D and B. Circuit E also has an input terminal 1406 for connecting to a top surface test enable pad 1403. Test pads 1402 and 1403 are similar to test pads 502 of FIG. 5, with the exception that they are connected to input terminals of Circuit E rather than to circuits (i.e. test buffers 611, 613 and test isolation buffers 617, 618 of FIG. 6) external of Circuit E. Circuit E of FIG. 14 may be a hard (i.e. fixed design) DSP/CPU core circuit that includes test input pads 1405 to simplify its testing when embedded within a die 1401.

Figure 15:
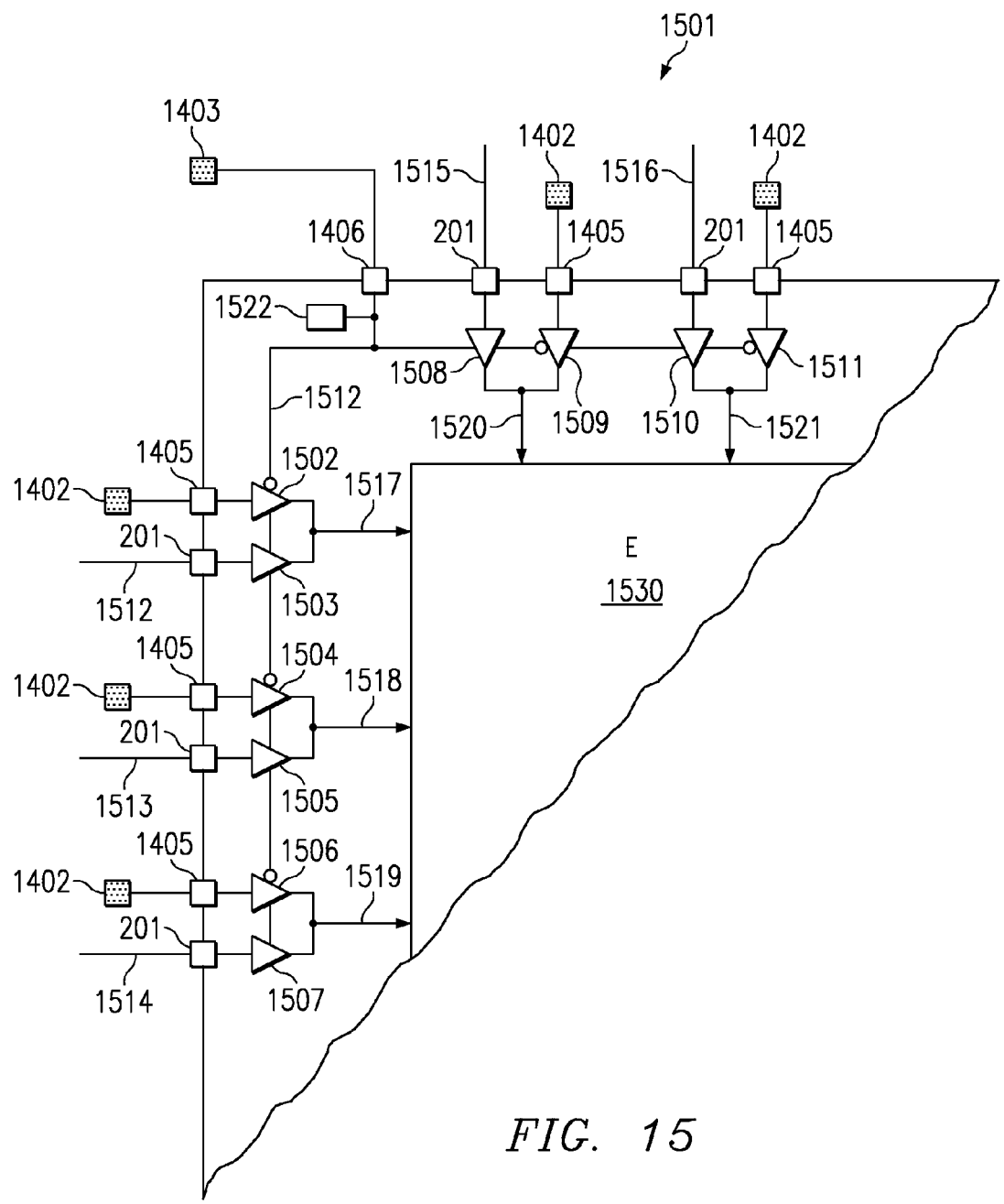
FIG. 15 illustrates in more detail the circuit of FIG. 14 with top surface test pad input terminals.

FIG. 15 illustrates a portion of circuit E 1501 of FIG. 14 in more detail. As seen, the input terminals 201 of circuit E are connected via wires 1512-1514 and 1515-1516 to the output terminals 202 of circuit D and B respectively. The wire connections 1512-1516 are free of the test isolation buffers 617 shown in FIG. 6, and directly connect the output terminals 202 of circuits D and B to the input terminals 201 of circuit E. As seen in FIG. 15, each of the top surface test pads 1402 is connected to one of the test input terminals 1405, and the top surface test enable pad 1403 is connected to the test enable input terminal 1406. Internal to circuit E 1501, a wire connection exists from the test enable terminal 1406 to the enable inputs of the test buffers 1502, 1504, 1506, 1509, and 1511, and to the enable inputs of functional buffers 1503, 1505, 1507, 1508, and 1510. The combination of test buffer 1502 and functional buffer 1503 form a multiplexer or switch whose output 1517 is input to functional circuitry 1530. Similarly the other test buffers 1504, 1506, 1509, and functional buffers 1505, 1507, 1508, and 1510 form multiplexers or switches that input to functional circuitry 1530 via outputs 1518-1521.

When the test enable pad 1403 is driven high by an external circuit/tester, the outputs of the functional buffers 1503, 1505, 1507, 1508, and 1510 will be enabled to allow functional signals from circuits D and B to be input to functional circuitry 1530 of circuit E. When test enable pad 1403 is driven low by an external circuit/tester, the outputs of the test buffers 1502, 1504, 1506, 1509, and 1511 will be enabled to allow test data from an external circuit/test to be input to the functional circuitry 1530 via test pads 1402. When test enable pad 1403 is not externally driven, a pull up circuit 1522 will force the test enable input terminal 1406 high to force functional operation of circuit E 1501.

In comparing the functional output to input connections between circuits D and E of FIGS. 5 and 6 to the function output to input connections of circuits D and E of FIG. 14 and 15, it is seen that the functionality of the test isolation buffers 617 of FIG. 6 is provided by the function input buffers 1503, 1505, 1507, 1508, and 1510 of FIG. 15. Thus circuits such as E 1501 that include input terminals for test 1405 and functional 201 inputs and multiplexing to select either the test or functional input to be input to functional circuitry 1530 provide a way to eliminate the need for external test isolation buffers 617 of FIG. 6. As can be understood, this improves the signaling time between circuits D and E since the delay associated with the external test isolation buffers 617 of FIG. 6 is not present in the signaling paths between D and E of FIG. 15.

It should be understood that the test enable pad 1403 of FIGS. 14 and 15 could also be connected to control the outputs of externally positioned test buffers and test isolation buffers, as test enable pad 1001 is shown doing in FIG. 10. Also it should be understood that if all circuits A-I of FIG. 14 used test 1405 and functional 201 input terminals and internal multiplexing as shown in FIG. 15, no externally positioned test isolation buffers 917 would be required in any of the output to input terminal connections 206 between circuits A-I or in the connections 205 between input pads 203 and input terminals 201 of circuits A, D, G, B, and C.

Figure 1:
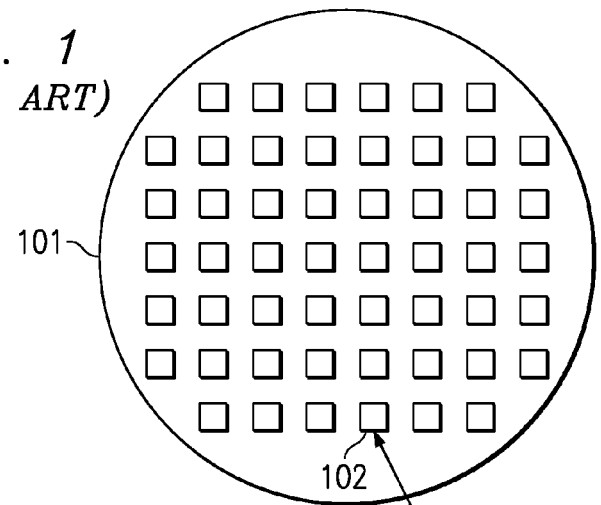
FIG. 1 illustrates a conventional semiconductor wafer.
Figure 2:
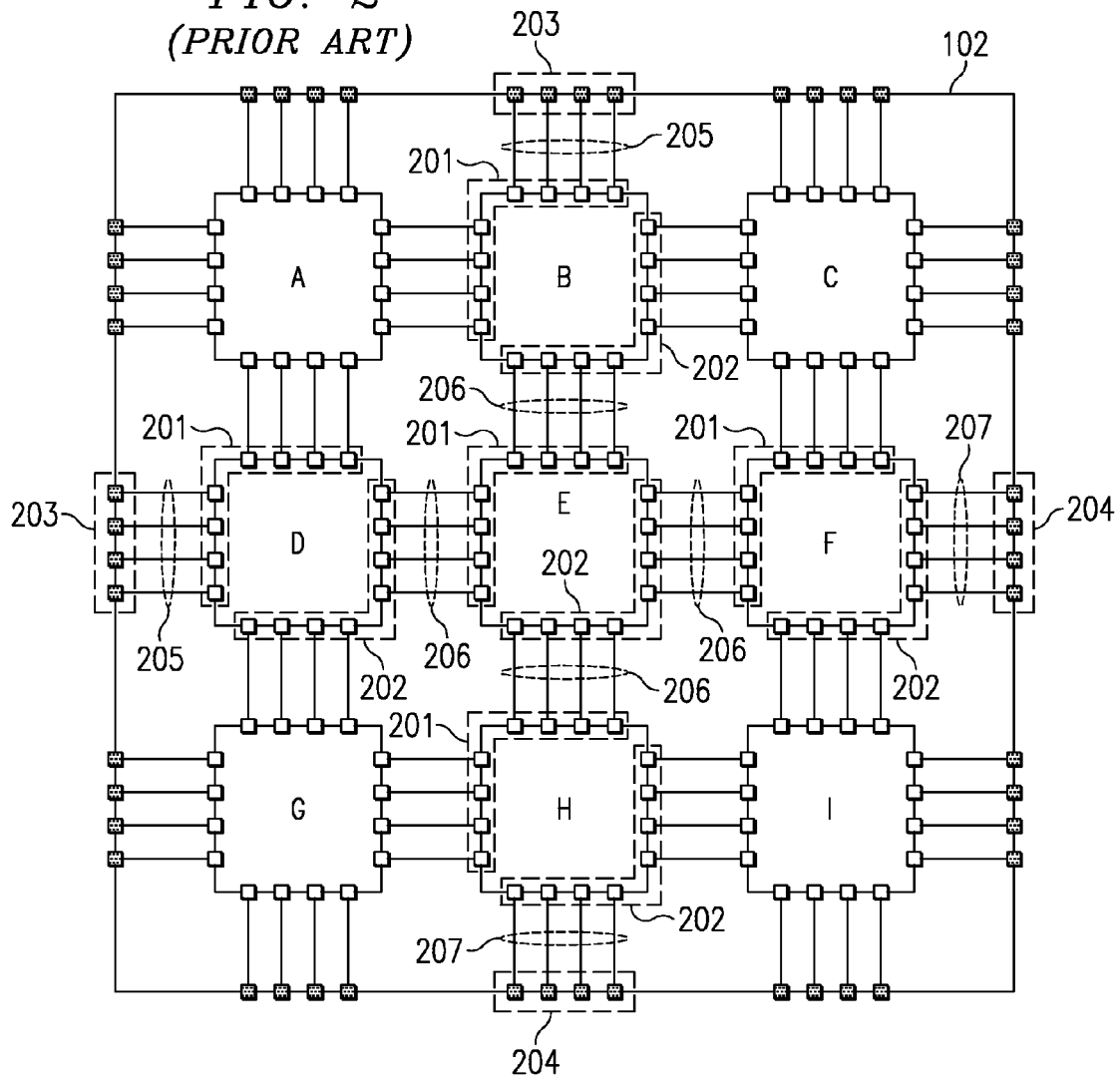
FIG. 2 illustrates a conventional die on the wafer of FIG. 1.
Figure 3:
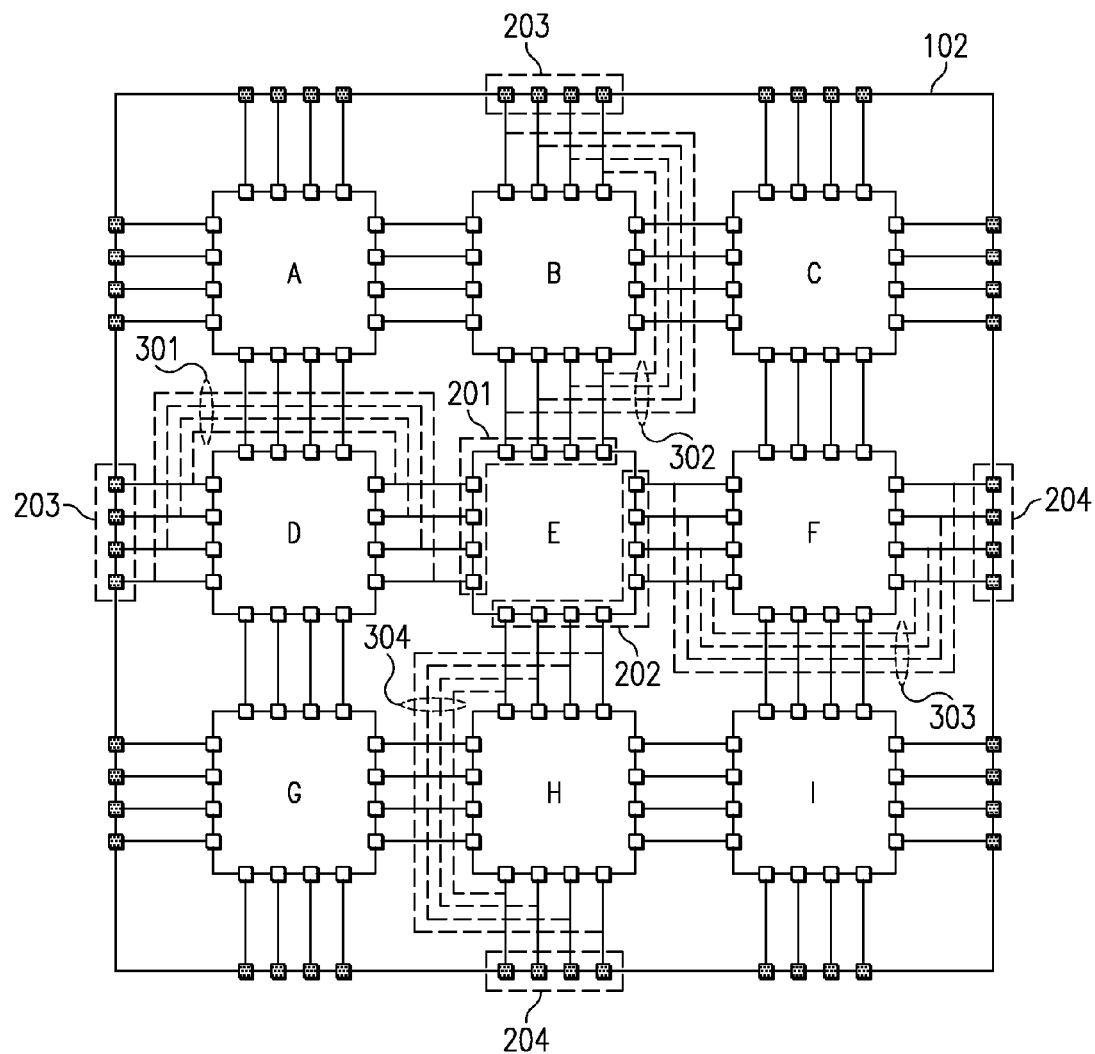
FIG. 3 illustrates a conventional test approach for testing circuit in the die of FIG. 2.
Figure 4:
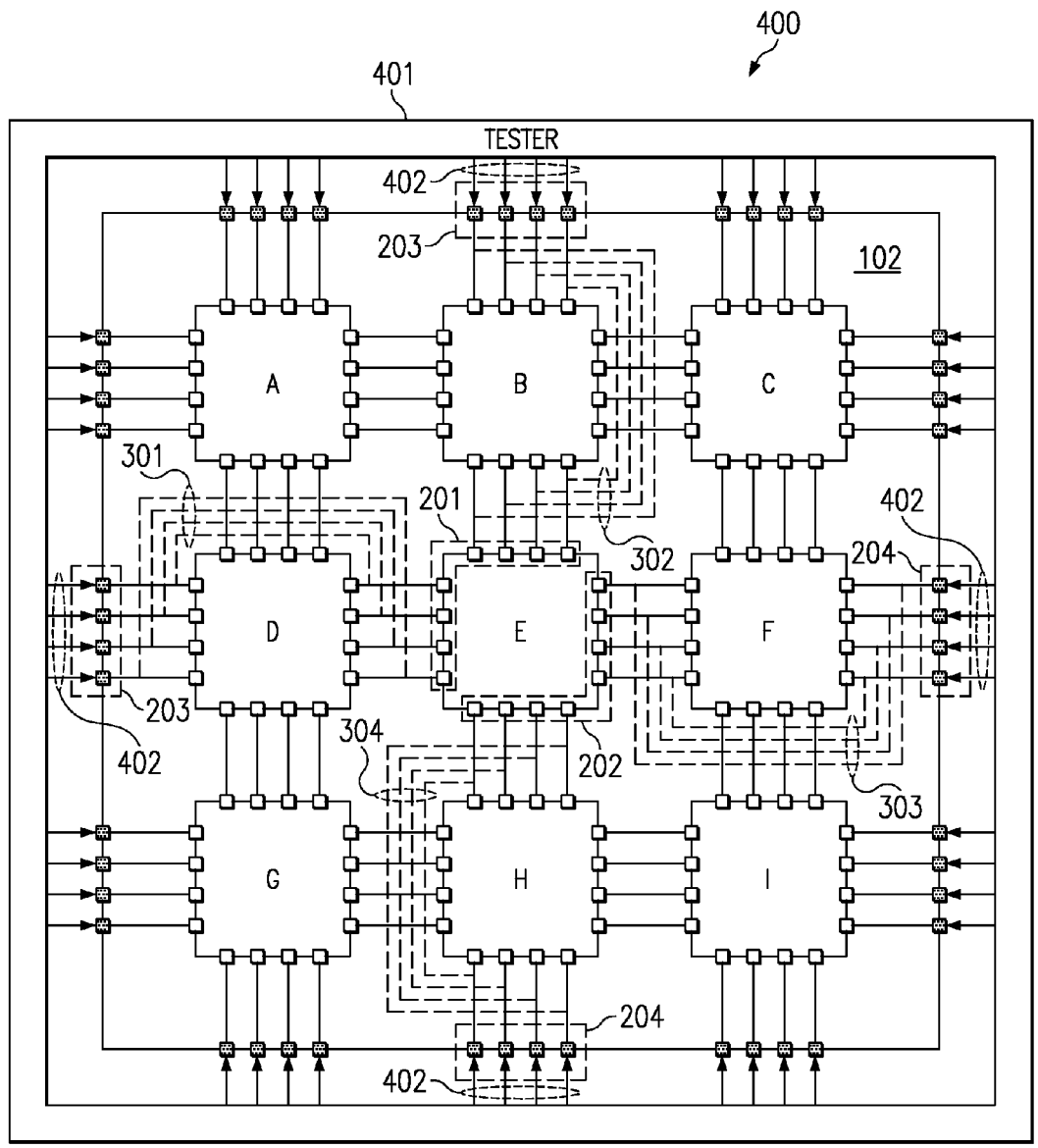
FIG. 4 illustrates a conventional die test arrangement.

From the descriptions given in regard to FIGS. 5-15, it is seen that the two problems mentioned in regard to FIG. 3 and 4 have been solved. The first problem, regarding test wiring overhead, is solved since the top surface test pads 502 only require a small amount of local test wiring at each of the circuits A-I being tested. The second problem, regarding test time, is solved since the local top surface test pads allow simultaneous testing of each of the circuits A-I.

During simultaneous testing of multiple circuits A-I in a die, the power consumption may increase beyond the normal functional power consumption. The reason for this is that during normal functional operation of a die, only some of the circuits may be operating at any one time. However during test, a tester may operate all the circuits at the same time in order to quickly complete the testing of a die.

Figure 16:
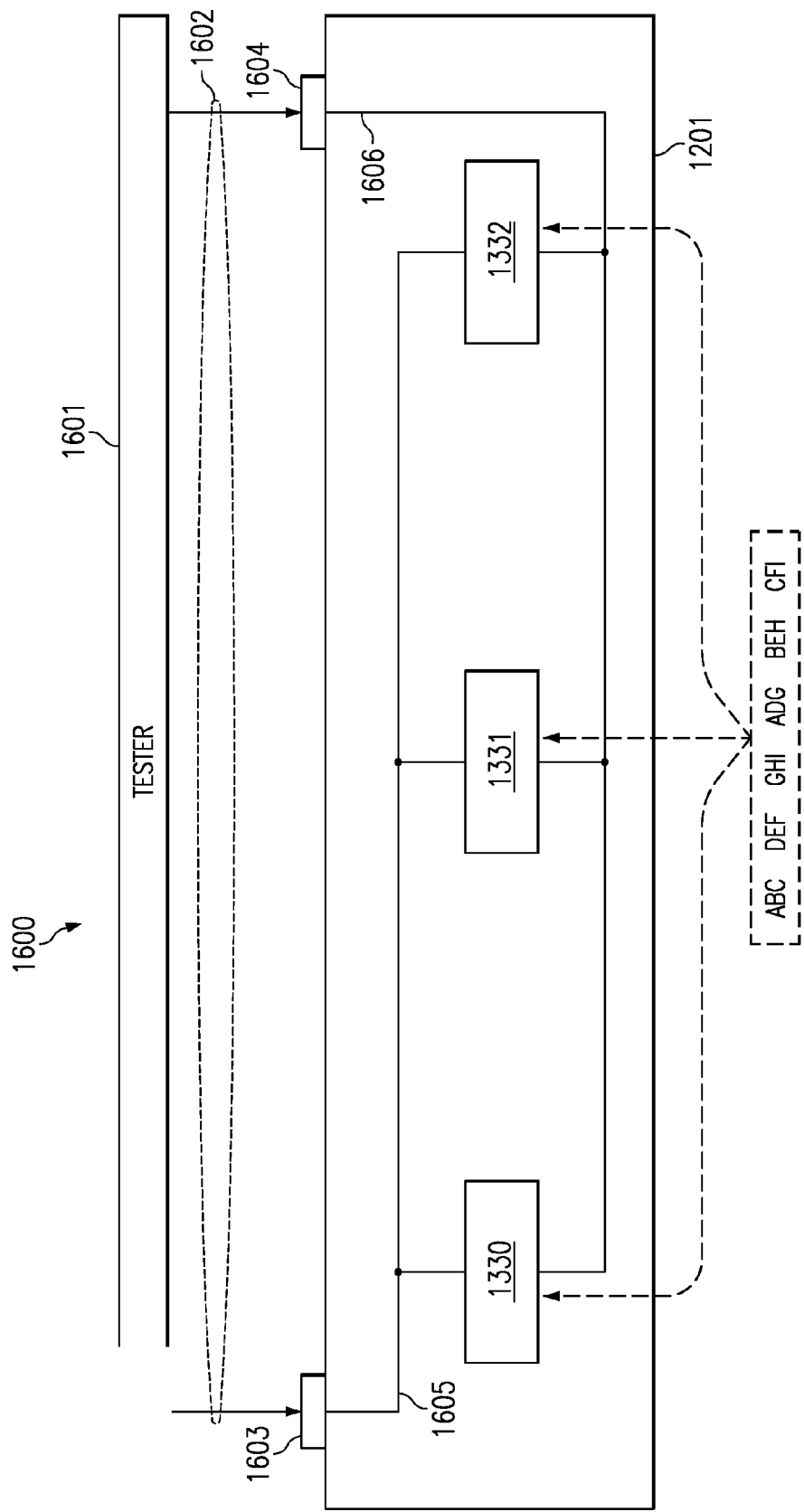
FIG. 16 illustrates conventional power and ground die pad probing.

FIG. 16 illustrates a test arrangement 1600 consisting of a tester 1601, probe mechanism 1602, and a die being tested. The die is assumed to be die 1201 of FIG. 12, which comprises circuits A-I represented in the cross sectional view of FIG. 16 as circuit blocks 1330-1332. The die 1201 has power 1603 and ground 1604 pads for powering up the circuits 1330-1332, via internal power rail 1605 and ground rail 1606 bussing. The power 1603 and ground 1604 pads, and rails 1605 and 1606 provide adequate power for the circuits to operate in functional mode. However, when the circuits 1330-1332 are tested simultaneously, they are not provided with adequate power to operate correctly. Thus during test the circuits 1330-1332 may fail not due to faults, but rather due to inadequate access to power and ground.

Figure 17:
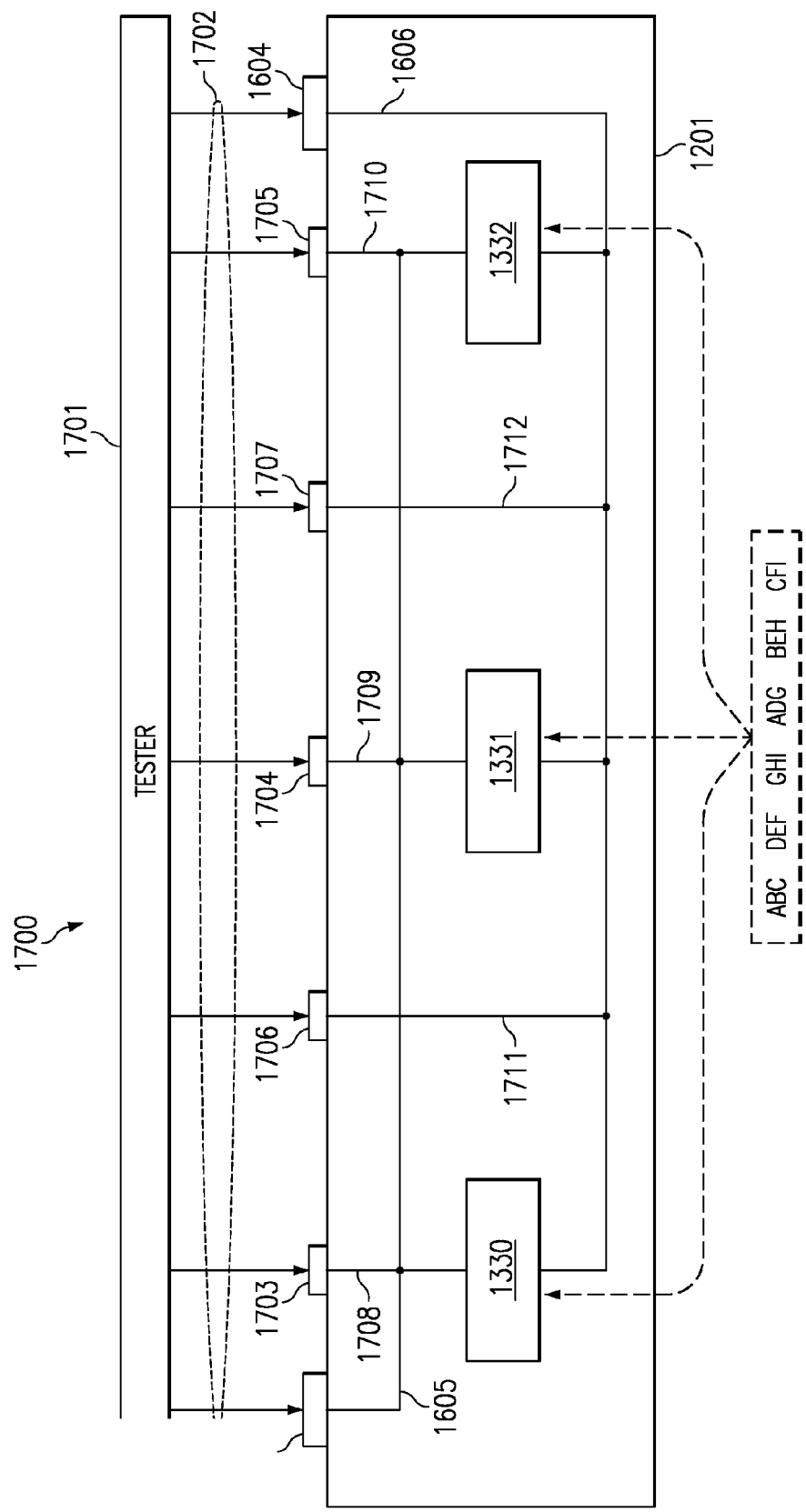
FIG. 17 illustrates power and ground test pad probing according to the invention.

FIG. 17 illustrates a solution, according to the invention, to the above mentioned power and ground problem during simultaneous circuit testing. FIG. 17 is similar to FIG. 16 with the exception that additional test power 1703-1705 and test ground 1706-1707 pads have been processed on the top surface of the die 1201. The additional test power 1703-1705 pads have been connected, via busses 1708-1710, to the power rail 1605. The additional test ground 1706-1707 pads have been connected, via busses 1711-1712, to ground rail 1606. During test, the tester 1701 and probe mechanism 1702 provide power to the normal power 1603 and ground 1604 pads and to the addition test power 1703-1705 and ground 1706-1707 pads. The additional test power and ground pads provide all the additional power and ground for the circuits 1330-1332 to be simultaneously tested without encountering the problem mentioned in regard to FIG. 16.

It should be understood that while the voltages of FIG. 16 and 17 were mentioned as being power and ground, the die could be a mixed signal type requiring additional voltages to operate analog circuitry within the die. If other voltage supplies are required, these other voltages could be supplemented with test pads as described for the power and ground supplies of FIG. 17.

It should be understood that while this disclosure has used buffers as the circuitry for coupling test pads (603, 605) to input and output terminals (201, 202) of circuits A-I, other types of switching circuitry could be used as well. For example, transmission gates could be used to couple circuit A-I input and output terminals to test pads.

It should be understood that while this disclosure has used buffers (617, 618) as the circuitry for isolating input and output terminals (201, 202) of circuits A-I during test, other types of switching circuitry could be used as well. For example, transmission gates could be used to isolate the input and output terminals of circuit A-I from each other during test.

It should also be understood that the circuits A-I could be digital, analog, or mixed signal circuit types, and said test inputs and/or test outputs to those circuit types could be in digital (1 and 0) or analog (continuously varying) signaling form.

It should be understood that when a die having test pads (502, 1503, 1506) processed on the top surface is prepared for packaging or assembly, an insulating layer may be processed on the top surface of the die to shield the test pads (power, ground, enable, input, and output test pads) from further external contact.

Although the present invention has been described in accordance to the embodiments shown in the figures, one of ordinary skill in the art will recognize there could be variations to these embodiments and those variations should be within the spirit and scope of the present invention. Accordingly, modifications may be made by one ordinarily skilled in the art without departing from the spirit and scope of the appended claims.

What is claimed is:

1. A die of semiconductor material, comprising:
   A. die pads;
   B. a first embedded circuit having input and output terminals;
   C. a second embedded circuit having input and output terminals;
   D. first leads connecting terminals of the first embedded circuit and the second embedded circuit to the die pads;
   E. second leads connecting terminals of the first and second embedded circuits together and being unconnected with the die pads; and
   F. test pads selectively coupled to the second leads, for each second lead there being a test pad associated with each embedded circuit.

2. The die of claim 1 in which the die pads are input and output pads for connection with external circuitry.

3. The die of claim 1 in which the first embedded circuit is one of a digital signal processor core, a microprocessor core, mixed signal circuitry, peripheral circuitry, and memory circuitry.

4. The die of claim 1 in which the second embedded circuit is one of a digital signal processor core, a microprocessor core, mixed signal circuitry, peripheral circuitry, and memory circuitry.

5. The die of claim 1 in which the second leads carry internal functional signals between the first embedded circuit and the second embedded circuit, and the internal functional signals are unavailable at the die pads.

6. The die of claim 1 in which the test pads carry only test signals and provide no functional communication to circuits external the die.

7. The die of claim 1 including additional test pads connected with the die pads.

* * * * *